United States Patent
Pejic et al.

(10) Patent No.: US 10,977,859 B2
(45) Date of Patent: Apr. 13, 2021

(54) AUGMENTED REALITY METHOD AND SYSTEM FOR DESIGN

(71) Applicants: Petar Pejic, Surdulica (RS); Frederic Bavastro, Monaco (MC)

(72) Inventors: Petar Pejic, Surdulica (RS); Frederic Bavastro, Monaco (MC)

(73) Assignee: Frederic Bavastro, Monaco (MC)

( * ) Notice: Subject to any disclaimer, the term of this patent is extended or adjusted under 35 U.S.C. 154(b) by 0 days.

(21) Appl. No.: 16/533,993

(22) Filed: Aug. 7, 2019

(65) Prior Publication Data
US 2019/0362545 A1 Nov. 28, 2019

Related U.S. Application Data

(63) Continuation-in-part of application No. 15/822,070, filed on Nov. 24, 2017, now Pat. No. 10,580,207.

(51) Int. Cl.
*G06T 17/10* (2006.01)
*G06F 30/13* (2020.01)
(Continued)

(52) U.S. Cl.
CPC .............. *G06T 17/10* (2013.01); *G06F 30/13* (2020.01); *G06K 9/00476* (2013.01);
(Continued)

(58) Field of Classification Search
CPC ......... G06T 19/00; G06T 17/20; G06T 17/00; G06T 15/10; G06T 15/00; G06T 17/05;
(Continued)

(56) References Cited

U.S. PATENT DOCUMENTS 5,815,417 A * 9/1998 Orr .................... G06T 17/05
340/506
6,295,066 B1 9/2001 Tanizak et al.
(Continued)

FOREIGN PATENT DOCUMENTS

| EP | 3489909 | 5/2019 |
|----|---------|--------|
| WO | WO 2004010384 A2 | 1/2004 |
| WO | WO 2016061267 A1 | 4/2016 |

OTHER PUBLICATIONS

Beom-Soo Oh et al., Progressive 3D Reconstruction from a Sketch Drawing, Computer Graphics and Applications, 2001. Proceedings. Ninth Pacific Conference on Oct. 16-18, Oct. 16, 2001, pp. 108-117, ISBN: 978-0-7695-1227-3, Piscataway, NJ, USA.
(Continued)

*Primary Examiner* — Abderrahim Merouan
(74) *Attorney, Agent, or Firm* — Cherskov Flaynik & Gurda, LLC

(57) ABSTRACT

A system for generating formal premises designs is discussed. The system begins by inputting an informal two-dimensional rendering of the premises. The system continues by analyzing the informal two-dimensional rendering and determining features found on the premises depicted by the two-dimensional rendering. The system then generates a three-dimensional model of the premises and populates it with interactive objects. Finally, the system provides multiple views of the three-dimensional rendering containing interactive objects.

20 Claims, 13 Drawing Sheets

(51) Int. Cl.
*G06T 19/00* (2011.01)
*G06K 9/00* (2006.01)

(52) U.S. Cl.
CPC ........ *G06T 19/006* (2013.01); *G06T 2200/24* (2013.01); *G06T 2210/04* (2013.01)

(58) Field of Classification Search
CPC ....... G06T 7/543; G06T 19/006; G06T 19/20; G06T 2200/24; G06T 2210/04; G06T 2219/2004; G06T 2219/2012; G06T 2219/2024; G06F 17/5004; G06K 9/00476
See application file for complete search history.

(56) References Cited

U.S. PATENT DOCUMENTS

| | | | | |
|---|---|---|---|---|
| 7,523,411 | B2* | 4/2009 | Carlin | G06Q 30/02 345/419 |
| 7,586,490 | B2 | 9/2009 | McDaniel | |
| 7,876,317 | B2 | 1/2011 | Zhang et al. | |
| 7,995,055 | B1* | 8/2011 | Ma | G06K 9/4604 345/420 |
| 8,395,614 | B2 | 3/2013 | Mikhailov | |
| 8,606,657 | B2 | 12/2013 | Chesnut et al. | |
| 8,791,942 | B2 | 7/2014 | Rivers et al. | |
| 8,793,108 | B2 | 7/2014 | Fu et al. | |
| 8,994,726 | B1* | 3/2015 | Furukawa | G06T 17/10 345/420 |
| 9,335,909 | B2 | 5/2016 | Sabanai et al. | |
| 9,355,470 | B2 | 5/2016 | Merrell et al. | |
| 9,536,340 | B2 | 1/2017 | Loberg | |
| 2002/0067354 | A1 | 6/2002 | Oh et al. | |
| 2002/0138228 | A1* | 9/2002 | Faulkner | G06T 17/05 702/138 |
| 2002/0180726 | A1* | 12/2002 | Shi | G06F 3/033 345/418 |
| 2004/0236561 | A1* | 11/2004 | Smith | G06F 17/50 703/22 |
| 2005/0073303 | A1 | 4/2005 | Harer et al. | |
| 2005/0081161 | A1* | 4/2005 | MacInnes | G06F 17/5004 715/765 |
| 2006/0082571 | A1 | 4/2006 | McDaniel | |
| 2006/0143221 | A1 | 7/2006 | Zhang | |
| 2007/0285668 | A1 | 12/2007 | Bertola et al. | |
| 2008/0175493 | A1 | 7/2008 | Katougi | |
| 2009/0102835 | A1 | 4/2009 | Mikhailov | |
| 2009/0144173 | A1 | 6/2009 | Mo et al. | |
| 2010/0066559 | A1* | 3/2010 | Judelson | G06T 19/00 340/8.1 |
| 2011/0175916 | A1* | 7/2011 | Noris | G06K 9/00416 345/441 |
| 2011/0304473 | A1* | 12/2011 | Ayala | G08B 7/064 340/691.8 |
| 2012/0050046 | A1* | 3/2012 | Satorius | G06F 19/3418 340/573.1 |
| 2013/0169817 | A1* | 7/2013 | Jones | G08B 25/14 348/159 |
| 2013/0179841 | A1* | 7/2013 | Mutton | G06F 3/04815 715/850 |
| 2013/0259308 | A1* | 10/2013 | Klusza | G06K 9/00624 382/103 |
| 2013/0262041 | A1 | 10/2013 | Fu | |
| 2014/0172378 | A1* | 6/2014 | Shim | G06F 17/5004 703/1 |
| 2014/0267717 | A1* | 9/2014 | Pitzer | G01C 15/002 348/143 |
| 2014/0358617 | A1* | 12/2014 | Lepage | G06Q 10/06313 705/7.23 |
| 2015/0193972 | A1 | 7/2015 | Algreatly | |
| 2015/0302639 | A1* | 10/2015 | Malekian | G06F 17/2288 345/420 |
| 2016/0110916 | A1* | 4/2016 | Eikhoff | G06F 16/5854 345/420 |
| 2016/0210377 | A1* | 7/2016 | Bumbalough | G06F 17/5004 |
| 2016/0300392 | A1* | 10/2016 | Jonczyk | G06T 19/003 |
| 2017/0091885 | A1* | 3/2017 | Randolph | G06F 17/5004 |
| 2017/0105129 | A1 | 4/2017 | Teplin et al. | |
| 2017/0256096 | A1* | 9/2017 | Faaborg | G06T 19/20 |
| 2017/0287447 | A1* | 10/2017 | Barry | G02B 27/0093 |
| 2017/0332203 | A1* | 11/2017 | Nagpal | H04W 4/029 |
| 2017/0363863 | A1 | 12/2017 | Chen | |
| 2018/0061084 | A1* | 3/2018 | Mitchell | G06T 11/001 |
| 2018/0061116 | A1* | 3/2018 | Mitchell | G06T 15/20 |
| 2019/0228115 | A1 | 7/2019 | Bergin | |
| 2019/0362545 | A1 | 11/2019 | Pejic | |

OTHER PUBLICATIONS

Philippe Dosch et al., Reconstruction of the 3D Structure of a Building from the 2D Drawings of its Floors, Document Analysis and Recognition, 1999, ICDAR '99. Proceedings of the Fifth International Conference on Bangalore, India Sep. 20-22, 1999, Sep. 20, 1999, pp. 487-490, ISBN: 978-0-7695-0318-9, Los Alamitos, CA, USA.

International Search Report and Written Opinion dated Nov. 11, 2020 of International Application No. PCT/EP2020/072125 (14 pages).

* cited by examiner

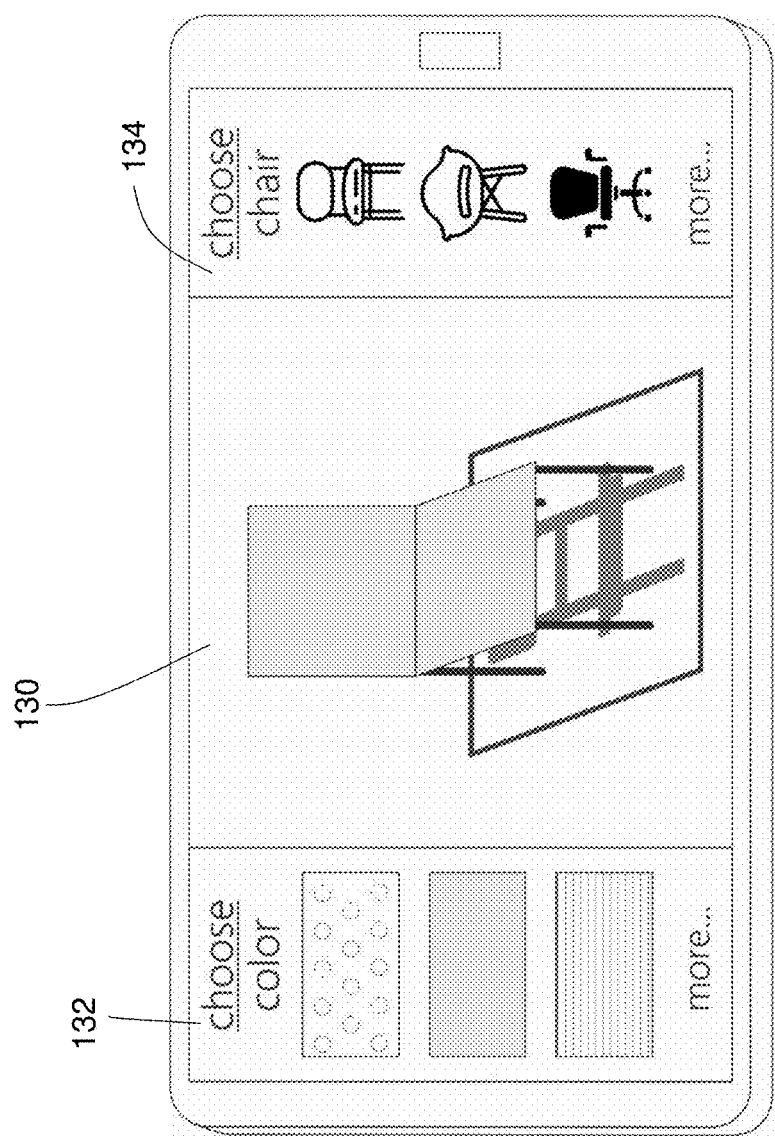

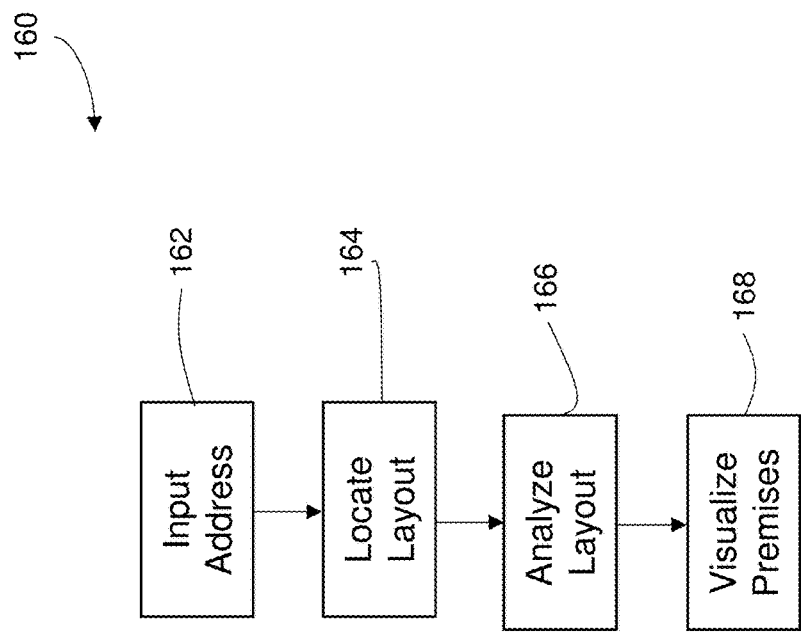

AUGMENTED REALITY METHOD AND SYSTEM FOR DESIGN

PRIORITY CLAIM

The instant application claims priority as a continuation in part of U.S. application Ser. No. 15/822,070 filed on Nov. 24, 2017, presently pending. The contents of the application are hereby incorporated by reference.

BACKGROUND OF THE INVENTION

1. Field of the Invention

This invention is directed to a method and system for aiding in design using augmented reality and virtual reality components.

2. Background of the Invention

Many design tasks have seen only incremental improvements stemming from computerization. On the one hand, computerization has ended the days of manual drafting and re-drafting of designs. On the other hand, the steps which occur before the design stage are not significantly different than they would have been without a computer. Mainly, a rough sketch is entered into a formal system which then proceeds to perform the three-dimensional modeling.

The entry of the initial design idea into a system is a considerable obstacle. The end user of the design software must become competent in use of the software. Different vendors take various approaches to the design input stage, and some are more successful at simplifying the task than others. However, the task of inputting the initial model of the design is an ever-present obstacle to many users beginning work on their design.

One area where this is apparent is interior design software. While the details of operation have changed, and some features such as three dimensional modeling are quite impressive, inevitably the user of such design software is presented with a blank page at start. It is up to the end user to draft within the software the dimensions of the rooms, the placement of windows and doors, and so forth.

These initial steps have not changed since the first interior design software packages became available for sale on the market decades ago. Many users are discouraged when facing such a blank page. Other users that persevere and attempt to use the software may inadvertently use the design tools in an unintended way, resulting in a design that is frustratingly incorrect or entirely impossible. The system will attempt to model a design that does not follow best practices, is not safe, or is not commercially feasible. Users who invest considerable time to learn design software only to find out the resulting design is ineffectual will be discouraged from using any tool in the future.

Previous attempts to solve this problem relied on ready-made templates which users then customize. While this solution will provide the users guidance to begin the work, it does not overcome the problems associated with learning an unfamiliar system. An additional tradeoff is that the users no longer have full flexibility in their design, without first extensively customizing the provided template. This significantly decreases the benefit of the design software. Eventually, in order to be able to create design which reflects the users' ideas, the users must either significantly customize the starting template or re-work the design using the system input tools.

Therefore, a need exists in the art for a system to simply the process of entering information into a software package. The system and method should use intuitive methods for every aspect of the design process, from adding the initial input to adding details to the initial input, and finally to revising the final design.

SUMMARY OF THE INVENTION

An object of the present invention is to provide a designer system and method that overcomes many of the limitations of the prior art.

A further object of the present invention is to provide a system that generates formal designs. A feature of the present invention is that several sources of input are combined to arrive at a formal design. An advantage of the present invention is that no single input method is required to create a final design.

Another object of the present invention is to provide a system and method for saving time during the design process. A feature of the present invention is that the method automates several design input tasks. An advantage of the present invention is that the end user of the system can be presented with a design input in a limited amount of time.

Another object of the present invention is to provide a system and method that does not require prior knowledge of computer-aided design software. A feature of the present invention is that the software accepts input from the user in an informal way without requiring the user to learn how to manipulate the input design within the software. An advantage of the present invention is that the end user may begin interacting with the software's analysis tools without first learning how to input the design into the software.

An additional object of the present invention is to provide a system and method that allows an end user to input a design into the software without becoming familiar with the rules of design within a particular area. A feature of the present invention is that the software analyses the end user's input and provides feedback regarding compliance with best design practices. An advantage of the present invention is that the software highlights best design practices for the end user as each best practice or industry standard is relevant to the end user's design.

Another object of the present invention is to provide a system and method of inputting a design to a computer-aided design package using intuitive mechanisms. A feature of the present invention is that an informal sketch by the user is used as the initial input of the design. An advantage of the present invention is that it obviates the need for formal input by the user.

A further object of the present invention is to allow the end user to sketch an informal design away from a computer. A feature of the invention is that the informal sketch may be provided to the system as a photograph of a line drawing or a scan of a sketch on paper. An advantage of the present invention is that the end user does not have to draw the sketch on a computer screen nor does the invention require the use of a touch screen. Instead, the input occurs in a method most familiar for the end user and the most comfortable for the end user.

Another object of the present invention is to provide a system which operates in any convenient form factor. A feature of the invention is that its interface is presented as a mobile application, in one embodiment. An advantage of the present invention is that it designs created within the system can be worked on anywhere the end user has access to even a small-screen mobile device.

A further object of the invention is to provide a three-dimensional model of the input design. A feature of the invention is that the informal input sketch by the end user is converted to a three dimensional model of the design. An advantage of the invention is that system converts a rough sketch into a computer-readable 3d model.

A further object of the invention is to provide a means to confirm the three dimensional model. A feature of the system is that in one embodiment the system-generated 3d model is superimposed using augmented reality back on the sketch by the end user. An advantage of the system is that the end user can see how the 3d model corresponds to the features drawn on the initial informal sketch.

A further object of the invention is to provide a means to refine the design throughout the process. A feature of one embodiment of the system is that previews of iterations of the design are shown to the user and the user is provided with an opportunity to update the design. An advantage of the system is that the end user will not waste time modeling or otherwise undertaking a detailed design that has unintended features or other errors.

A further object of the invention is to provide an environment to finalize a design. A feature of one embodiment of the system is that all design elements can be added within the system, as appropriate to the task. For example, where the system is modeling a residential property, the system includes a facility to add furniture to the 3d model. An advantage of the system is that it supports detailed designs using custom and pre-existing components.

An additional object of the system is to facilitate creation of a final design. A feature of the system is that it provides suggestions to the end users on how to finalize the design. An advantage of the system is that it provides the end users with multiple choices for feature designs and suggests certain options depending on user preferences.

A further object of the system is to provide a means for the end user to interact with the final design. A feature of the system is that it generates a photo-realistic virtual reality review of a finalized design. An advantage of the system is that it provides a customizable virtual reality environment for the final design.

An additional benefit of the system is that it provides manufacturers for an easy way to showcase products suitable for an end users' design. A feature of the invention is that it provides promotions of certain third party products within the design environment. A benefit of the system is that it allows for additional exposure for third party products by customers currently engaged in design tasks.

Briefly, the present invention provides a system for designing an environment, the system comprising inputting into the system an informal two-dimensional rendering of the premises; analyzing said informal two-dimensional rendering; determining features found on the premises depicted by the two-dimensional rendering; generating a three-dimensional model of the premises; populating said three-dimensional rendering with interactive objects; and providing multiple views of the three-dimensional rendering containing interactive objects.

BRIEF DESCRIPTION OF THE DRAWINGS

The invention together with the above and other objects and advantages will be best understood from the following detailed description of the preferred embodiment of the invention shown in the accompanying drawings, wherein:

FIGS. 7A-F depict the steps of one embodiment of the invention;

FIG. 8 depicts a flowchart of another embodiment of the invention.

DETAILED DESCRIPTION OF THE INVENTION

The foregoing summary, as well as the following detailed description of certain embodiments of the present invention, will be better understood when read in conjunction with the appended drawings.

As used herein, an element step recited in the singular and preceded with the word "a" or "an" should be understood as not excluding plural said elements or steps, unless such exclusion is explicitly stated. Furthermore, the references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

As described herein, one embodiment of the system comprises a designer of interior habitable spaces. However, the same design strategies can be used for any design task, including interior spaces, exteriors of buildings, design of new consumer products, the design of circuit elements, and other tasks.

Overview

Figure 1:
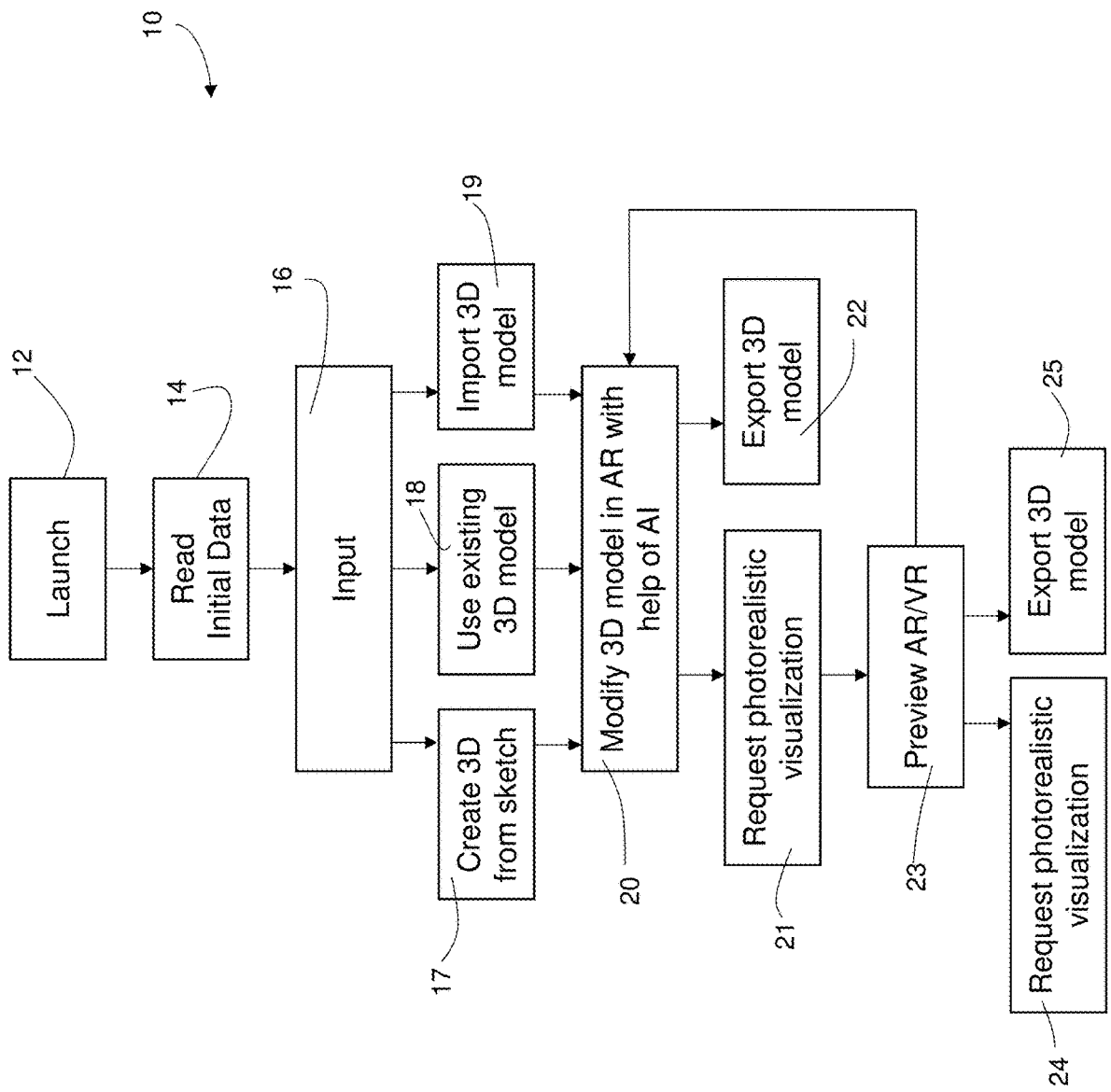
FIG. 1 is a flow chart describing the operation of one embodiment of the present invention.

An overview of the system is shown in the flowchart depicted in FIG. 1. The system comprises computer readable software which is loaded on a suitable device. Suitable devices include portable computers, cellular phones, tablets, and other similar devices which include input and output devices. In the embodiment described herein, the device must have access to an imaging device, such as a camera or a scanner.

Further, the embodiment described herein includes both a user-interactive component and a server-side component, each of which will be described below.

The operation of the system 10 begins with the launch 12 step. As part of the launch 12 step, the system 10 ensures that the user-interactive component is authorized for use, the software is up to date, and is properly installed on compatible hardware. In one embodiment, the launch 12 step includes a check to ensure that the system is being used in an authorized geographical region, and also has access to all the necessary server-side components. Following initialization, the system loads user settings. In one embodiment, the user settings are provided in a second data store, such as a cloud-based account. In another embodiment, the user settings are requested from the user at the time the application is installed.

Subsequently, the system 10 reads initial data 14. The initial data reading step 14 includes accessing both the local storage on the device presenting the user-interactive component and communicating with the server-side component to determine if the authorized user has uploaded any designs in progress to the server. The initial data 14 comprises built in templates, object information, and information on modeling walls, doors, and windows, in one embodiment.

Once the system 10 completes the initialization step 14, the user is provided with an opportunity to either resume work on an existing design, or begin a new design. If the user wishes to begin a new design, the user is asked to input 16 the basic parameters of the design. In one embodiment, the input step 16 comprises the user placing the image capture device over a rough sketch of the system to be modeled, as described in step 17. In another mode, the input step 16 comprises providing the system 10 with an image file containing a scan of the sketch by the end user.

The photo of the sketch or the scan of the sketch must include sufficient detail for the system 10 to process the image information during the input step 17. In one embodiment, the minimum requirement for a camera-captured image is that it contain at least 4 megapixels of information, with each boundary comprising at least 20 pixels of high contrast data. For a scan of the sketch, the system requires an image scanned with at least 300 dpi and no more than 1200 dpi.

In one embodiment, the photo should be taken no more than 12 inches above the paper sketch of the design. In one embodiment, in order to be accepted, the sketch must fill at least 80% of the image area of the photo.

In one embodiment during the input step 17, the user is provided feedback if the image to be used for input is of a sufficient quality, including image features such as contrast, sharpness, and quantity of details necessary for augmented reality presentation, as discussed herein.

In one embodiment, the system 10 requires the user to provide a single image of a sketch. In another embodiment, the system 10 accepts a series of images, such as a video stream and performs the subsequent steps for each significantly altered frame of the video. This provides the user an opportunity to review the proposed detected designs to ensure which one is the best approximation of the user's intended design.

A common feature to these embodiments is that the end user provides the initial sketch in a physical medium and not directly in the system 10. Thus, the end user is never faced with a simple 'blank canvas' approach of other design programs. The input step 17 of the system 10 is in this way also tied to a particular physical-world object—the sheet of paper that the end user uses to perform the initial sketch.

As shown in the flow chart of FIG. 1, the input step 16 operates in three modes: as described above the input 16 can operate in the sketch input mode 17 wherein a three-dimensional model is created from a physical sketch. Alternatively, the end user may use an existing model in another mode 18. The existing model step 18 is used when the end user is provided with an apartment that had been modeled by a third party. For example, in one embodiment of the system 10, the user is provided with an existing 3d model when the user scans a bar code provided by a developer of a property. In a third mode 19, the end user can import a 3d model from another source, such as a website or a 3d model provided by a professional.

Process for Creating the Preliminary Three-Dimensional Model

As mentioned above, as part of sketch input step 17, the end user can create a 3d model from a two-dimensional sketch. The details of this process are as follows:

Starting point for this process is an informal physical sketch, which is provided to system as a digital image (*.jpg or *.png file format).

Image is then converted to numerical matrix, where each pixel of input image is converted to number. In the process of converting, the system reads the color value and based on starting criteria defined for wall color (usually black or gray-almost black) the system transforms pixel to a corresponding number.

Then the system performs analysis on the matrix of values.

First, the system uses a search algorithm to go through matrix in order to find field which are potentially part of wall. In one embodiment, this requires the system to iterate over the values of the matrix, searching for numbers which are used for wall marking. The output of the first step is a determination of potential wall positions represented in the image data matrix.

Second, following the completion of the search algorithm the system performs a check of thickness. If thickness of that part is sufficient, the system considers that sufficiently thick line to represent a starting point of wall. In one embodiment, the minimal thickness to designate a wall is determined on the basis of matrix resolution and scale of starting informal drawing.

Next, the algorithm tracks the matrix field with desired numbers in order to find contours of all walls.

After all potential walls are located, the algorithm will search for windows and door patterns connected to walls.

When all floor plan elements are determined the system begins the space analysis.

First, the system determines all separated spaces inside floor plan (all separated rooms).

Second, the system calculates their area (how much square meters) and determinate which of them are connected to outside of apartment/house. And which is connected with another rooms.

Next, based on industrial standards of space size, and connections the system predicts the type of each room. The system assigns a potential name for each of them (kitchen, living room . . . ), in one embodiment. The end user then can confirm or change detected space names.

In this way, the system gives feedback. If something is not right, like small space for certain type of room, or missing doors resulting in isolated rooms.

At the end, on the basis of detected floor plan elements the system creates simple 3D model of walls with doors and windows and write name of each room. This completes the sketch input step 17.

Modification Steps

Once one of the potential input steps 17-19 is completed, the system 10 moves on to the step 20 of modifying the layout using augmented reality. The end user is presented with a preliminary three-dimensional model of the design. The user is provided with an opportunity to accept the preliminary model or reject it, resulting in the system returning to the input step 16.

In one embodiment, if during the layout confirmation step 20 the end user rejects the preliminary model, the end user is asked to provide feedback as to the reasons for the rejection of the preliminary design. The created three-dimensional model is thereafter erased from the device memory and the user is transferred to the first screen of the application, in one embodiment.

Following the acceptance of the preliminary design during the confirmation step 20, the system 10 begins finalization of the design by the addition of all design elements. The detection step comprises the system 10 reviewing the preliminary model to determine significant features of the design, such as rooms, the purpose of each room, and the likely location of structural features such as columns and structural beams. The output of this step is only a 3d model of the structures—windows and door placements are determined in the initial sketch analysis step.

In one embodiment, the detection step also analyzes the preliminary model to determine the likely design choices given the information available about the user provided in the read initial data step 14. For example, if the designer is a family with a young child, the suggested design will include features designed to be age-appropriate. Artificial intelligence supports user choice on the basis of the user's preferences, in one embodiment. In one embodiment, the program offers the user a choice from several interior design images in order to determine the user's preferences. In this embodiment, the system suggests to the user which furniture to include, which color of wall, type of floor, based on the user's earlier preferred final design. Also when user chooses one preferred piece of furniture, for example a sofa, the AI suggests to the end user coffee tables which matches the materials, style, color and other attributes of the selected sofa. The end users selections are recorded in the machine learning system and are used to generate further suggestions in future choices, in one embodiment.

Once the modification step 20 is completed, the end user may export the three-dimensional model 22 or may request a photorealistic visualization 21 of the premises.

In one embodiment of the system 10, an augmented reality feature is included. It superimposes both the preliminary design (the output of the modification step 20) on the original sketch which was used in the input step 16. In this way, the end user may confirm that both the preliminary design and the final three-dimensional design is as the user intended.

In one embodiment of the system 10, the final design is previewed 23 in augmented reality against the sketch on the sheet, as discussed herein. During review the user can review design and make additional changes. As the review is done using Augmented Reality, the user can intuitively see the 3D model on the top of sketch. Simple rotation of sketch will rotate all aspects of the 3D model, zoom in and zoom out is done by going closer and further from sketch. During this Augmented Reality Review, the user without previous knowledge of complex 3D program command can manipulate the 3D model. User is able to change furniture (with several choices available from a data store) or change color, texture, position or orientation in Augmented Reality scene. This embodiment is compatible both with hand-held AR systems and head mounted AR systems. In another embodiment, the system 10 includes a virtual reality confirmation feature. In this embodiment, the user, wearing a suitable virtual reality headset or using a VR 360 presentation on a single device screen, can view both the preliminary design and the final three-dimensional design. In one embodiment, the virtual reality feature is integrated into the client-interface application and runs on a single multi-purpose device such as a smart phone, which is interfaces with an optional virtual reality headset. In one embodiment, the user relies on Augmented Reality to perform preliminary design and manipulate same. In order to see final design user need to request final photorealistic visualization, the virtual reality feature is invoked. However as the 3d model must be rendered remotely using high performance computing resources. Even if it does not require remote computing power, this processing will take some time, as such the virtual reality confirmation is used only for the final design, in one embodiment. The photo-realistic final design is delivered as AR photorealistic 3D model, or 360 VR virtual tour, in one embodiment.

During the review of the three dimensional model step 20, the system 10 also populates the environment and design with interactive objects, as will be described below.

In one embodiment, the population stage includes proposing to the end user various design components, such as floor and wall decoration, suitable to each detected room type. For example, different floor choices will be suggested for a bathroom than a living room.

The population phase also includes the addition of interactive objects, such as furniture. In one embodiment, the system shows the end user furniture from a particular collection or supplier, depending on the sponsorship of the client-side application. All objects presented by the system 10 to the end user are intended to be interactive in that their physical properties can be changed and they may be used while the system is in the virtual reality or augmented reality preview mode.

Once the end user has accepted a design, the final version of the design is presented during the photorealistic visualization step 24. The final design may be examined as part of a virtual reality review or can be projected back onto the input design using an augmented reality preview mode. Alternatively, or in conjunction with the photorealistic visualization, the end user may also export the extended three-dimensional model 25.

Detection and Analysis Step

Figure 2:
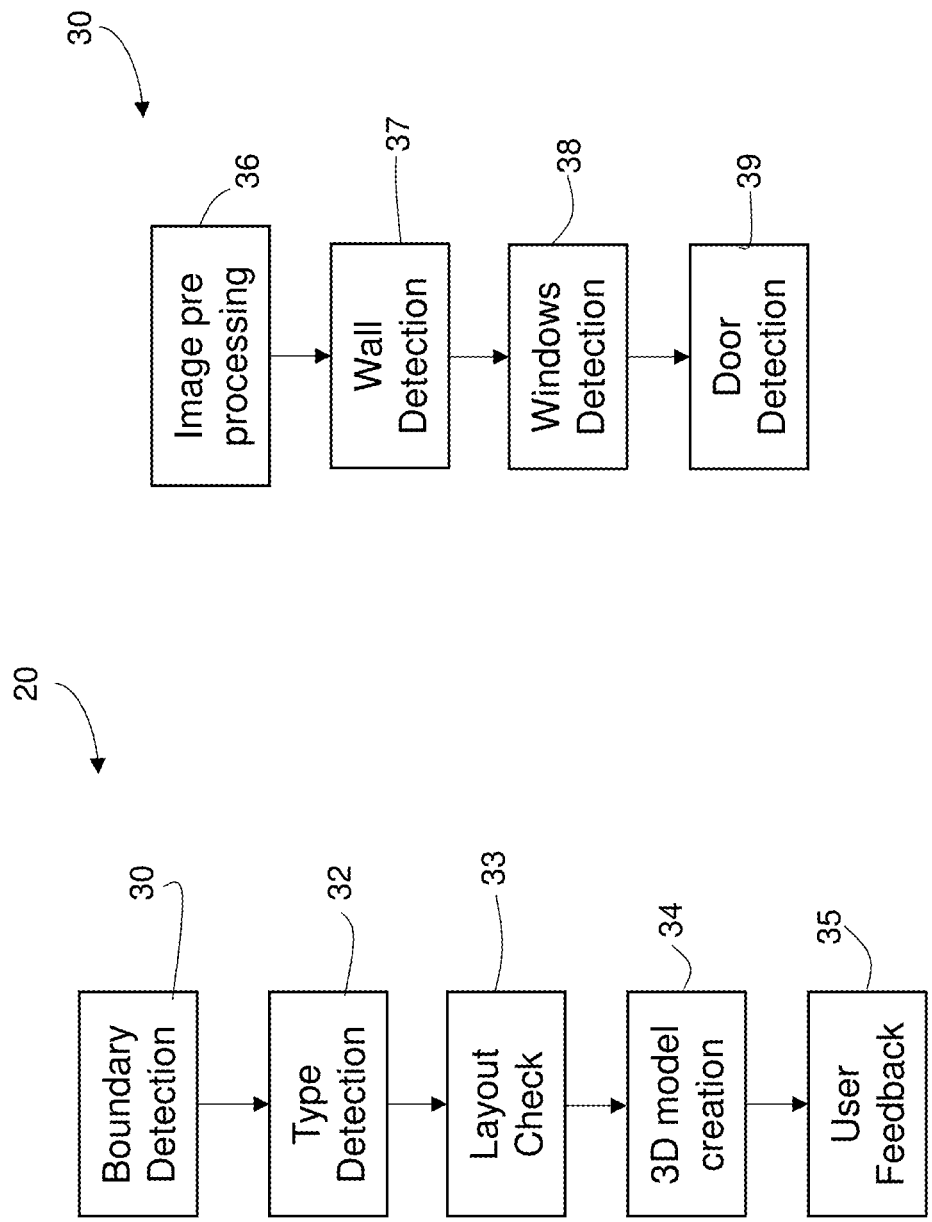
FIGS. 2A and 2B depict flow charts describing the details of the design modification step, in accordance with the features of the present invention.

The details of the design input step 20 are shown in FIG. 2A. The design modification step 20 takes as input the preliminary model that the end user has confirmed as part of one of the input steps 17-19.

The first phase in the detection step is boundary detection 30. The system 10 determines where the bounds of the design are, including the walls of each room, the locations of windows in each room (as depicted on the users' sketch), and the connecting interior doors in each room.

The detection step 20 also includes a detection of the type of each room 32. In one embodiment, the possible types include living room, bedroom, dining room, kitchen, bathroom, storage, office, and others. The users are asked to confirm the system detection, in one embodiment.

After determining the likely type of each room in stage 32, the system 10 performs a series of layout checks 33. The system will ensure that the layout does not have unintended features, such as dead space, rooms open to each other that likely should not be connected to one another (such as a bathroom that transitions to another room), and other likely design errors. For example, the system 10 as part of the layout check stage 33 will ensure that no hallway is narrower than a minimum size or that each bedroom has sufficient space for a bed and also storage.

Once the layout has been checked, the system 10 generates or updates a three-dimensional model as part of the update step 34.

Following the detection step 32 and the layout check step 33, the system 10 requests user feedback 35. This user feedback step 35 occurs at the end of the detection and analysis phase 20, in one embodiment. In another embodiment, the feedback step 35 occurs in an iterative fashion, throughout the design process. In yet another embodiment, the feedback step 35 occurs whenever the system 10 makes a decision on behalf of the end user with regards to one of the design choices.

The output of the detection and analysis step 20 is the final three-dimensional design with the major features of the interior space identified and quantified.

The details of the boundary detection step 30 are shown in FIG. 2B. The steps include first performing basic image pre-processing 36 to eliminate any artifacts in the input. For example, any spurious dots in the input file should be marked as errors and not rendered as interior walls or columns.

Once the pre-processing is complete, the system determines where in the model the walls 37 are to be located. The system determines which walls are likely to be load bearing and which ones are only small partitions. The system also determines which walls 37 are likely to be full height and which walls do not extend the full height of the room.

Upon defining the walls, the system detects where in the layout the windows 38 are placed. In one embodiment, the windows detection 38 is performed using indications in the input sketch 16. The system 10 supports a large library of window styles and as part of the window detection 38 the end user can confirm or change the style of windows in the premises. In one embodiment, the process is iterative, so that once the room type is detected as part of type detection step 32, the windows are updated. For example, if the detection 32 indicates that the room is a bathroom, the window type will be set to a translucent window instead of a transparent window.

Finally, as part of the boundary detection step 30, the system also performs door detection 39.

Object Population Step

Figure 3:
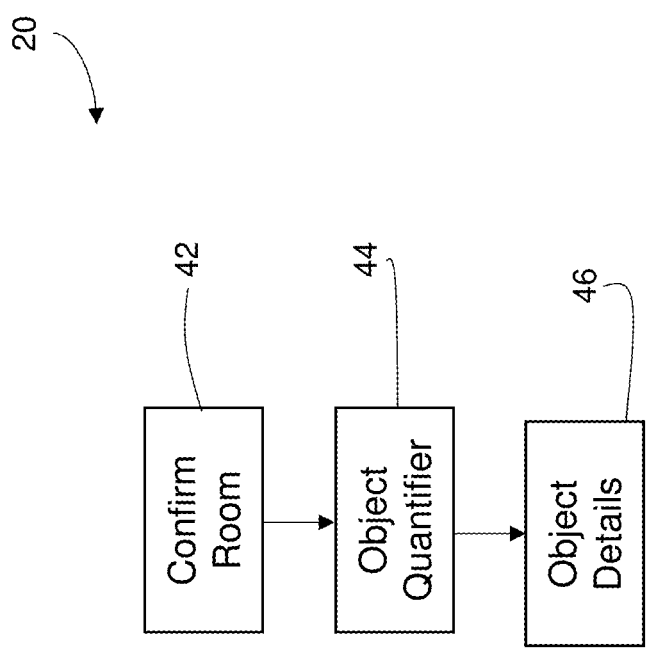
FIG. 3 is a flow chart showing the details of the analysis stage.

Turning now to FIG. 3, the flow chart of the modification step 20 which describes the steps to populate the design with objects.

The population step 20 accepts as input the final three-dimensional design generated by the analysis step 20. The population step 20 begins by confirming the properties of each room 42. In one embodiment for each room the system 10 confirms room properties, such as light exposure, size of room, and purpose of room.

For each room on the premises, the system 10 employs an object quantifier 44 to select objects. In one embodiment, the objects include fixtures such as appliances, as well as moveable objects such as furniture. The object quantifier is a combination of a server-side and client-side database in one embodiment.

In one embodiment, the object quantifier 44 includes different sets of objects depending on the status of the system 10. For example, the system 10 may be authorized to display objects from only one supplier.

In another embodiment, the end user controls the available objects in the object quantifier 44, but only if the end user has paid for an unlimited access version of the client-side application. In yet another embodiment, each end user has access to a library of objects within the object quantifier 44 depending on the status of the end user's subscription with the system 10.

In one embodiment, the object quantifier 44 only displays as available physical objects that are available for purchase at a particular location.

Each object which is added to the three-dimensional environment may be customized by setting various object details 46. For example, for flooring objects, the end user will have the option of selecting multiple colors, textures, and materials. Similarly, for any furniture objects, the end user may select properties of the furniture such as color, height, and other features.

Each object is designed to be interactive during either a virtual reality review of the design or an augmented reality review of the design.

Details of Design Finalization Process

After acceptance of an interior model at the conclusion of step 20, the user continues with final customization of interior, in one embodiment.

In one embodiment, the user can chose to get system suggestions for furniture placement and style or to continue with integration of 3D furniture models on his own.

If the user chooses system help, in one embodiment, on the basis of detected and defined space, system creates suggestions of basic furniture placement in each room. In one embodiment, the system employs industry standards and rules and users preferences.

The output is a system suggestion to the user where to put furniture, such as a sofa in a living room. The system uses factors such as free space, other room connections windows and doors positions. Further, the system uses a user preference for the style of sofa, in one embodiment. By dragging the suggested furnishings within the interface, the user can change all of suggested positions and type of furniture.

Further, in one embodiment, the user can add new furnishings, where the system AI will assist the end user and suggest furniture with similar style and color as one already integrated and in accordance with user preferences.

If user chose to set up furniture without system assistance, the system will nonetheless suggest furniture to use, in one embodiment. In both cases user can change position, orientation, type, color, textures of all furniture inside his interior in order to get final 3D model.

After finishing and inserting all desired 3D model of furniture and equipment user can request final processing, such as by requesting a photorealistic visualization 24 or the exported 3d model 25.

Example Interface

Figure 4:
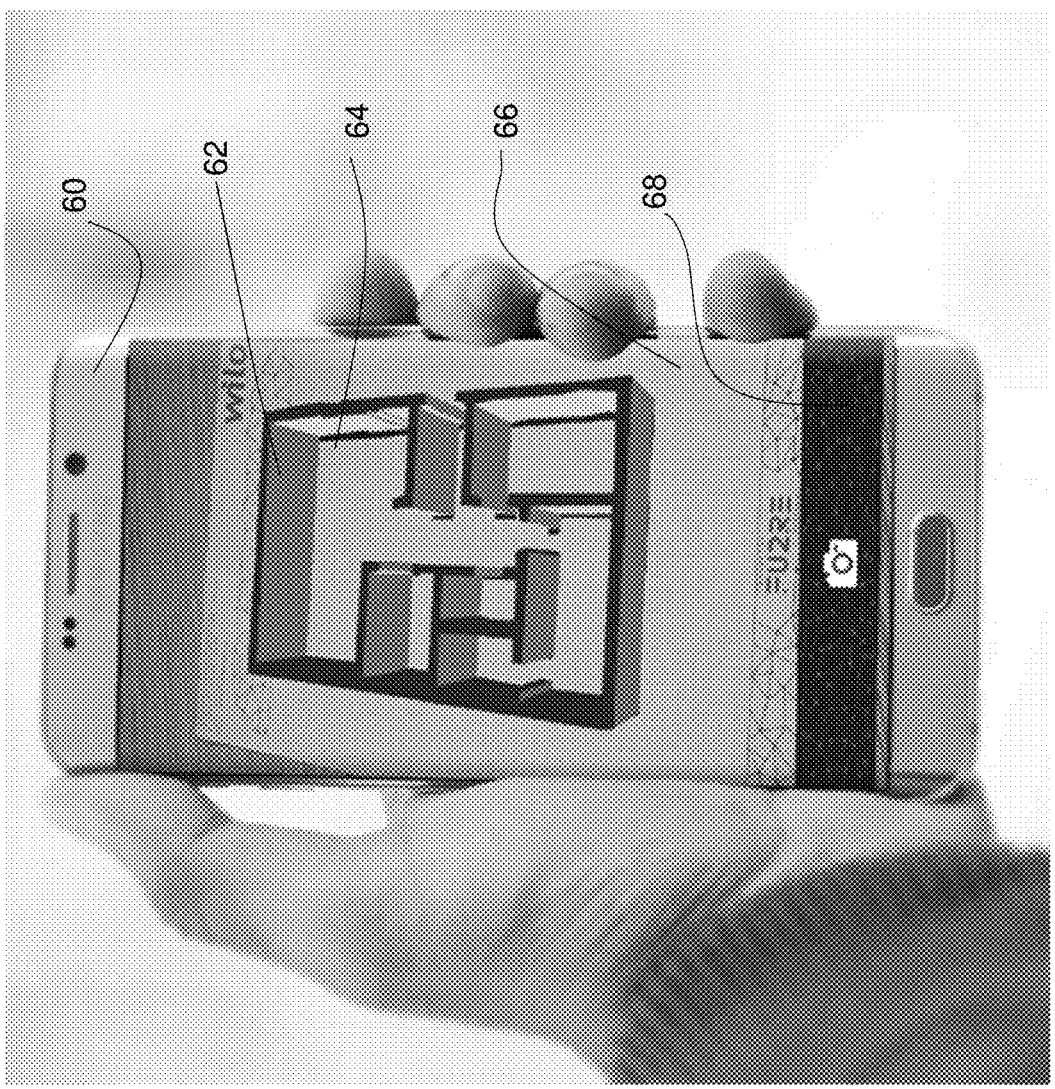
FIG. 4 is an example of a user interface of one embodiment of the invention.

A sample user interface is shown in FIG. 4. As shown in FIG. 4, the system 10 interface shows the step 18 of confirming the layout. The interface is shown on a portable device 60. The system 10 is showing the preliminary design 62 as super-imposed on a photo of the two-dimensional sketch 64. The sketch 64 is drawn on a sheet of paper 66. The sketch fits within the boundaries of the device 60 screen 68.

Figure 5C:
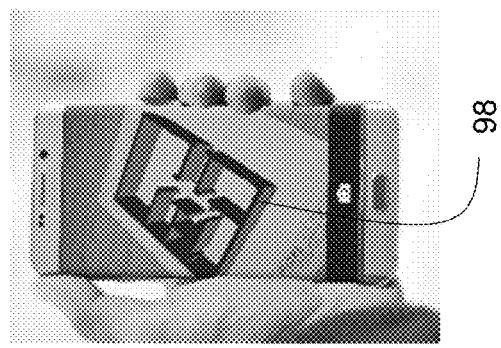
FIGS. 5A-C is an overview of the operation of one embodiment of the invention.
Figure 5B:
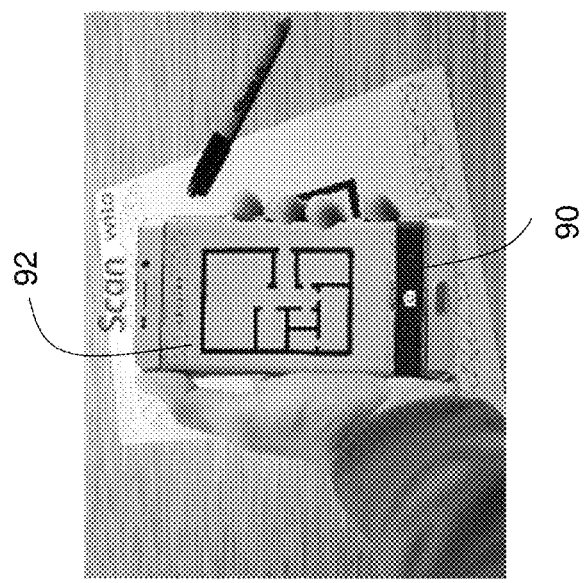
Figure 5A:
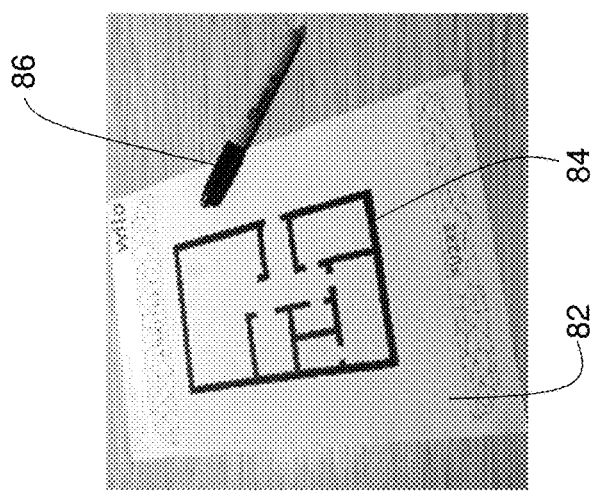

Three phases of the system are depicted in FIGS. 5A-C. First, as shown in FIG. 5A, the end user draws an informal two-dimensional sketch 82 on a piece of paper 84 using a high-contrast marking instrument 86, such as a marker.

Second, in FIG. 5B, the end user takes a photo of the sketch using a portable device 90, such as a cell phone. The phone accepts the input of the paper-based sketch 84 and displays the input to the user 92, already rotated and de-skewed. Finally, as shown in FIG. 5C, a three-dimensional design 98 is shown to the end user, following the detection 20 step. The three-dimensional design 98 is shown in an augmented reality mode by superimposing the design 98 on the photo of the sketch.

Figure 6:
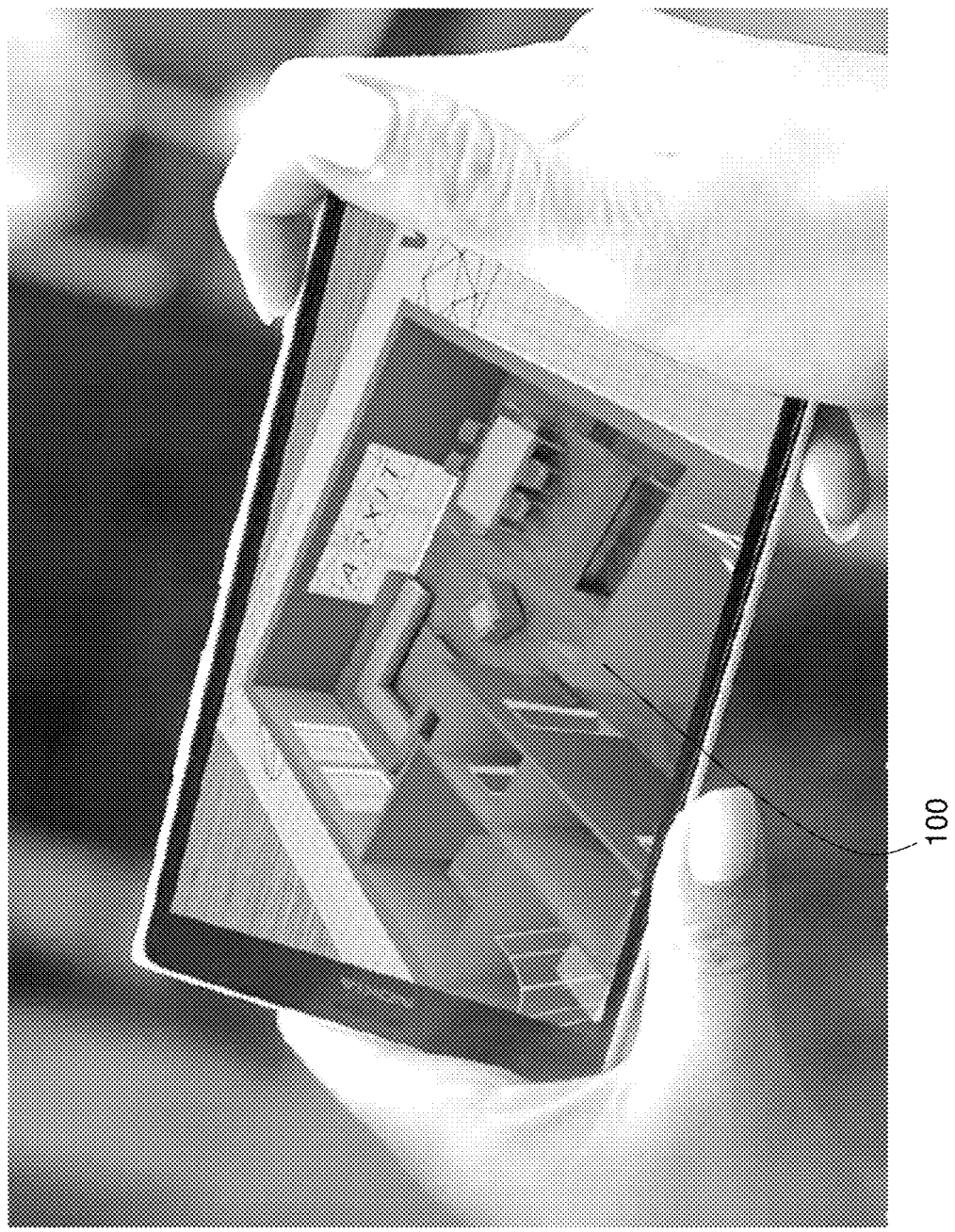
FIG. 6 depicts the output of one embodiment of the present invention.

Turning to FIG. 6, the final design 100 is shown to the end user, again in the augmented reality mode, depicting the output model on the original sheet of paper.

Design Process Example

Figure 7A:
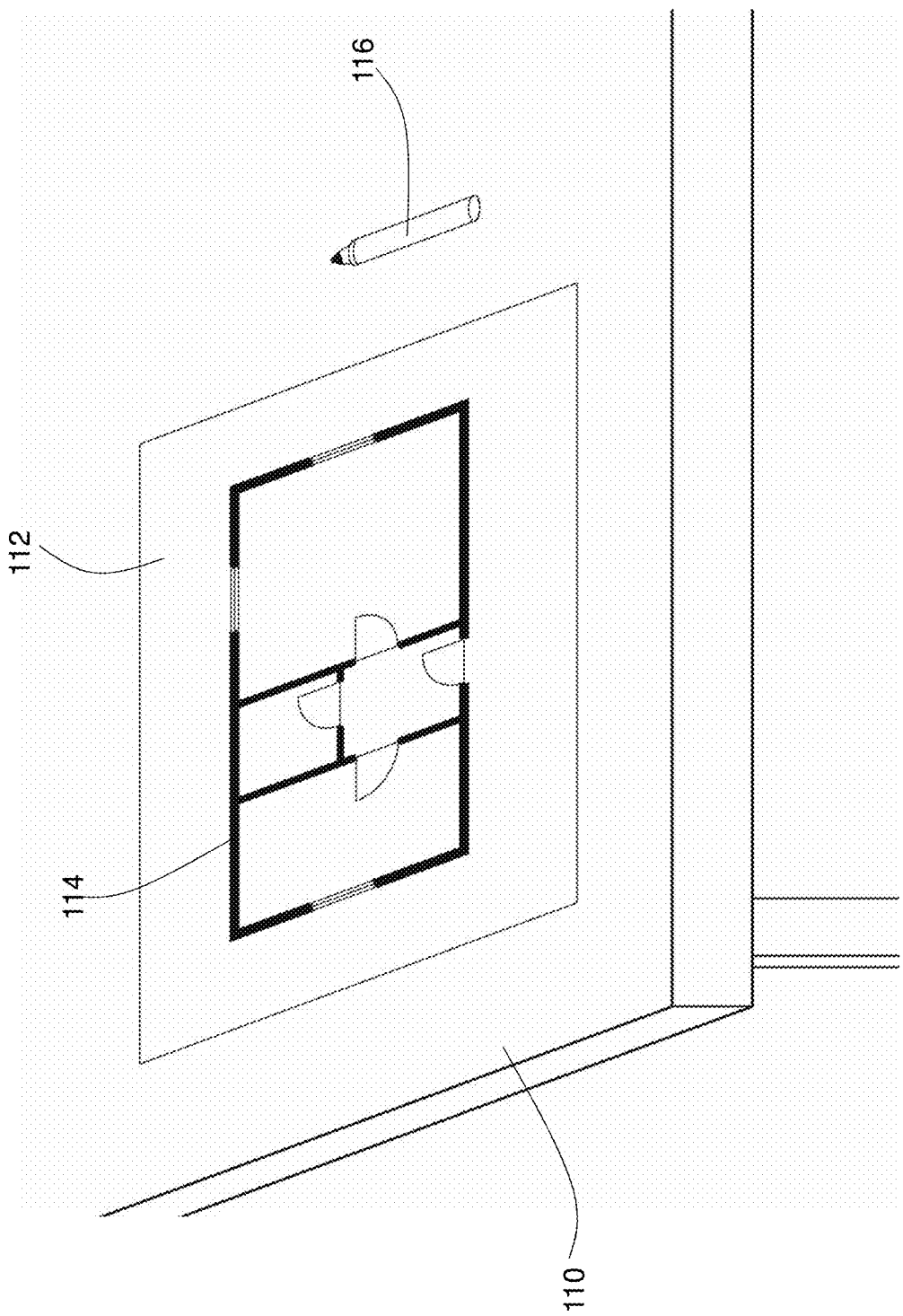

FIGS. 7A-F depict an overview of the design process using one embodiment of the invention. As shown in FIG. 7A, the process begins with a sheet of paper 112 on a work surface 110 such as a table shown in FIG. 7A. The end user draws a sketch 114 on the paper 112 using a suitable writing utensil 116. While the sketch shown in FIG. 7A depicts features such as doors and windows in a formal manner akin to an architectural drawing, the system accepts as input an informal drawing where the doors and windows are indicated in any number of possible ways. The system is able to infer which user-selected symbols indicate a door or window.

In one embodiment, the system indicates to the end user if a particular room is unreachable or if too many rooms lack windows as these may indicate that the design is incomplete.

Further, while the sketch 114 shown in FIG. 7A appears formal, it nonetheless is lacking many architectural details that are not required by the system. For example, the sketch 114 does not need to include a formal scale or a legend of symbols.

Figure 7B:
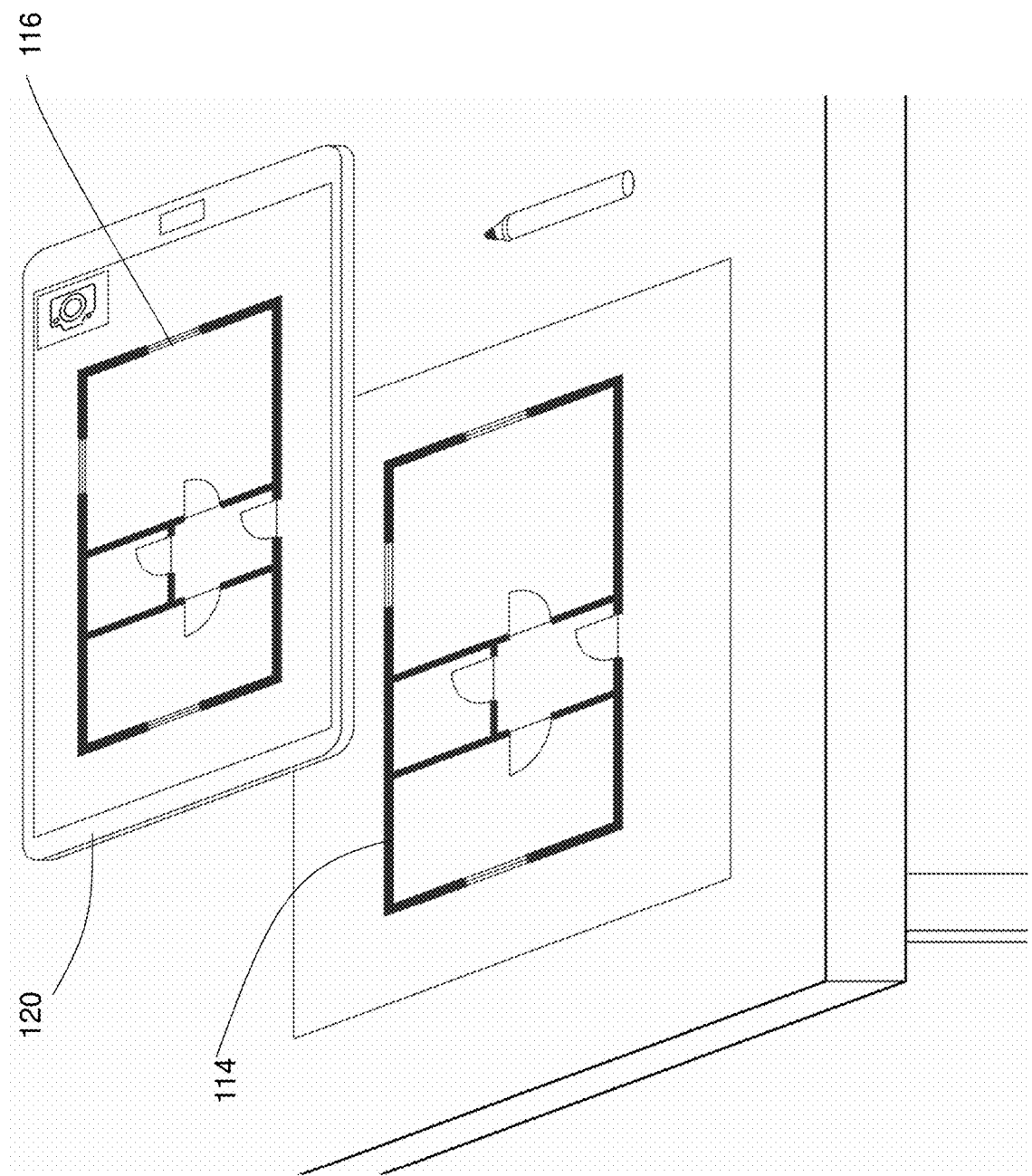
Figure 7C:
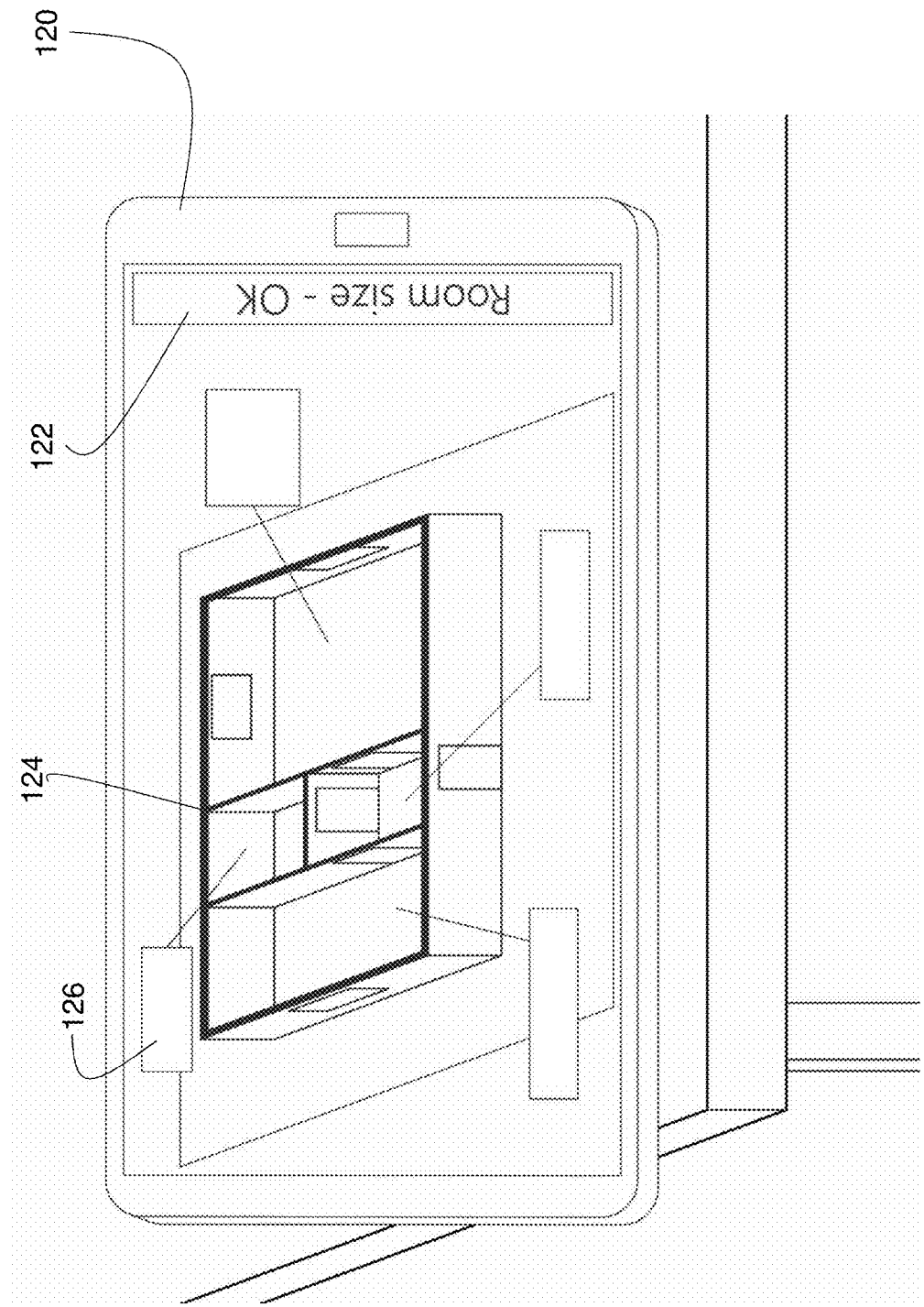

As shown in FIG. 7B, the user thereafter invokes an application on their device 120 which is used to capture a photo or video 116 of the sketch 114. The sketch 114 is thereafter in the memory of the device 120 and can be interacted with using the device 120.

The device 120 thereafter generates a three-dimensional model 124 of the sketch 114. The purpose of each room is indicated 126 to the end user. The end user has the opportunity to change the layout by interacting with the three-dimensional model 124 on the device 120 and can also confirm the model 122. As discussed above, to rotate the model 124 of the space, the end user may rotate the sheet 112 which contains the sketch 114 (visible in FIG. 7A).

As part of the design process, the end user is provided with suggestions for objects 130 as shown in FIG. 7D. The end user may customize the color 132 and type 134 of each object 130 presented to the end user in the system.

Figure 7E:
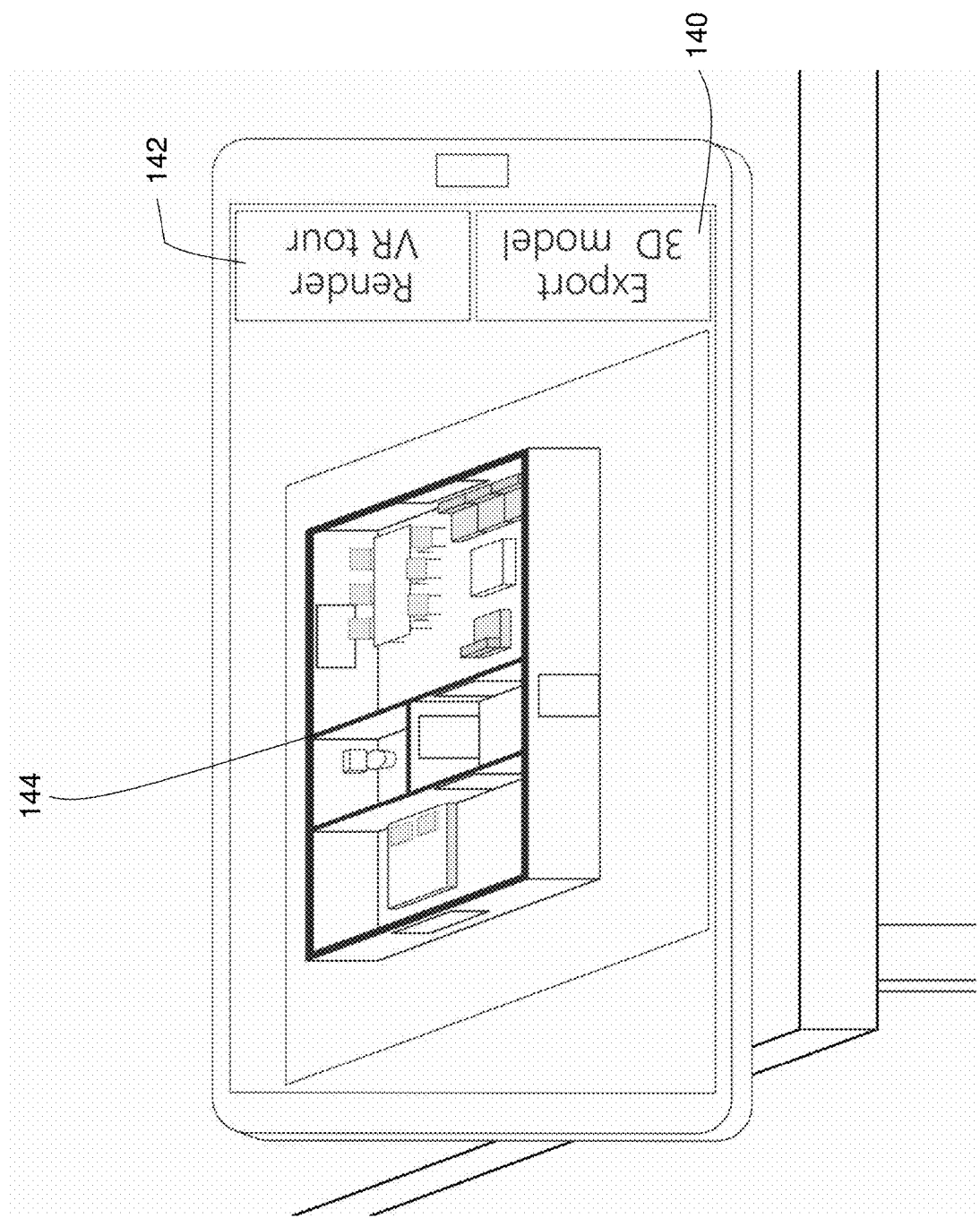

Per FIG. 7E, once the three-dimensional model is populated by objects, the end user may export the three dimensional model 140 or render a virtual reality tour 142 of the populated model 144.

Figure 7F:
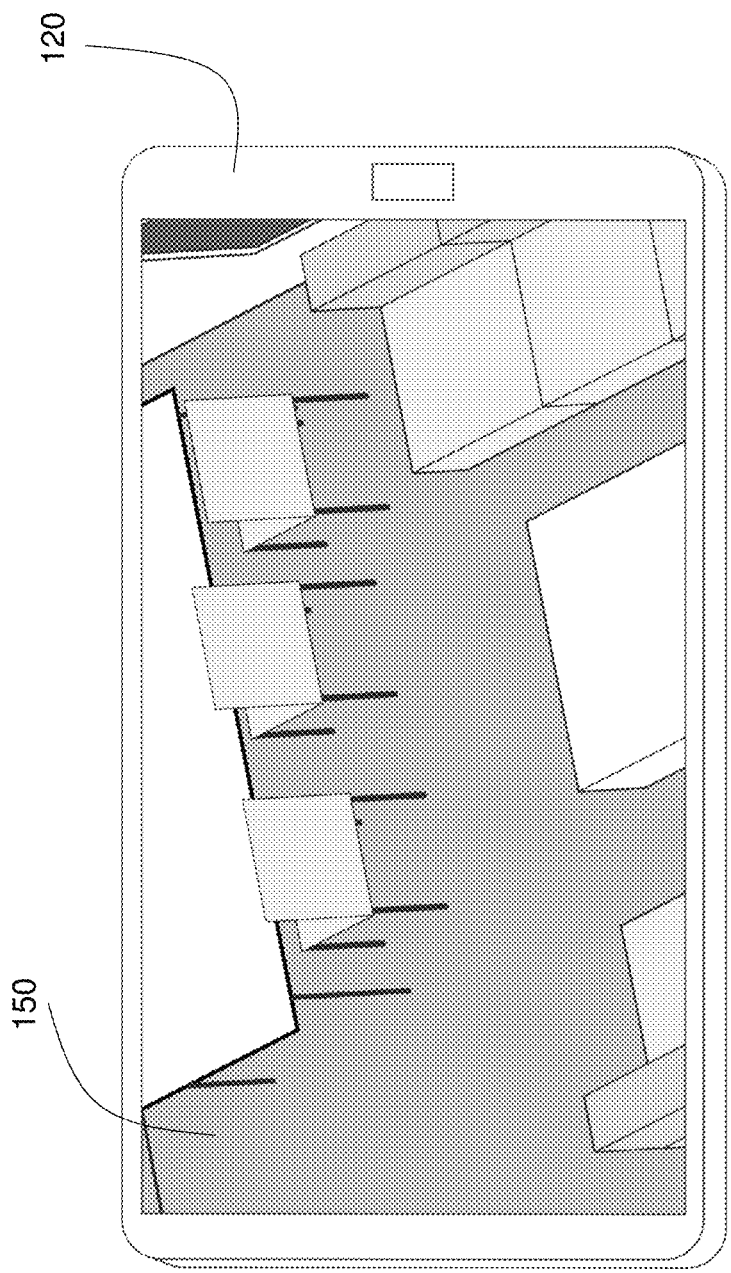

As shown in FIG. 7F, the system will display the virtual reality tour 150 on the device 120. While the virtual reality tour 150 is depicted on the device 120, it is rendered in a remote system, in one embodiment, as described above.

While FIGS. 7A to 7F show consecutive steps, the steps are also iterative, in one embodiment. As such, the end user may change the physical sketch 114 and the device 120 will re-render the three-dimensional view 124.

On Demand Rendering in Time Sensitive Applications

A unique set of challenges are faced by first-responders who have to enter premises in time-sensitive situations such as persons entering a building in an emergency. In almost situations, first responders are entering a building for the first time, and have a specific task to accomplish, such as addressing a fire or locating a suspect on the premises. Therefore, they do not have time to become acquainted with building plans, which require interpretation and can be ambiguous. In many instances, first responders, such as firefighters will rely on simple drawings of the premises found in the lobby of the building by the fire alarm station. Those drawings often do not reflect changes of the building due to remodeling. They are also only available for larger commercial buildings, while the majority of emergencies occur in smaller residential buildings.

In one embodiment, shown in FIG. 8, the system is used to retrieve two-dimensional plans from a data store, renders the premises in a user-friendly three-dimensional view, and presents the view to the first responders as needed.

As shown in FIG. 8, the on demand rendering embodiment 160 allows an end user to input an address 162. In one use scenario, the address is input by first responders, such as firefighters, responding to an incident at a specific building. In one embodiment, the address input step 162 comprises of a manual entry of an address. In another embodiment, the address information is retrieved from a data source, such as an emergency response system, such as the first responder dispatch system.

The embodiment 160 then locates and retrieves the two-dimensional layout of the building 164. In one embodiment, the data store of the layout information 164 is a central municipal repository, such as an office handling building permits. In another embodiment, the layouts are located with private property assessment companies, such as ones that handle insurance assessments. The information of the layout of the premises 164 is securely shared, in one embodiment, for the limited purpose of giving first responders information about the premises. In most instances, the layouts located in step 164 will include varying levels of complexity and most will reflect professional drafting standards. In one version, the system 160 recognizes the type of building layout being analyzed. For example, if the system 160 recognizes that it has retrieved the technical drawings for the building's electrical installation, the system 160 will disregard certain details from the document, such as location of light fixtures and electrical outlets. Instead, the system will only model the actual layout of the building's interior.

In most instances, the locate layout step 164 will refer to an electronic data store. However, the system 160, in one embodiment also allows the end user to provide the system with a photograph of a paper version of the layout.

In one embodiment, the system 160 also attempts to address the situation where the locate layout step 164 was not able to find any plans for the particular address. In one embodiment, the system requires a building plan for the specific premises to be on file. In another embodiment, the system will indicate that exact building plans are not available and perform a broader search of the databases. The search criterion could include properties built by the same developer at about the same time frame. In another embodiment, the system compares the street view of the building with the expected appearance of the front of the building based on the plans on record to ensure that the building plans match up with the current premises.

Next, using the processes described above, the system 160 will analyze the layout 166. During this step, the system 160 undertakes the same sort of analytical steps as described above, including determining the location of doors and windows, rooms sizes, and types of rooms. The identification of the type of room is particularly useful in an emergency situation, where the responders need to reach the building's bedrooms as quickly as possible.

Finally, after analyzing the layout 166, a visualization of the premises is presented. In one embodiment, the visualization is presented as a 3-dimensional model on a portable device. In another embodiment, the visualization comprises an augmented reality presentation or a virtual reality presentation.

In one embodiment, the visualization 168 includes way-finding markers, such as arrows, pointing the direction of areas of interest, such as bedrooms.

A benefit of this system is that it can generate a visualization 168 of a building from a wide variety of building plans, on demand, without altering the original plans or specifically preparing them for this use. The system does not need access to high quality plans for all buildings in a given city because in one embodiment it will match plans to similar buildings.

In one embodiment the system operates in the following steps. First, an individual or a system such as a security contacts the emergency department to inform them of a fire or other incident providing the address either directly or indirectly. Second, the address is sent instantly to at least one database computer system who recognizes the address and find the floor plan. In one embodiment, the step of matching the address to a floor plan uses artificial intelligence. In one embodiment, the floor plans are sourced from multiple datastores. For example, in some jurisdictions, all new developments are required to provide a computer-readable version of final building plans. In another jurisdiction, the source of the plans includes insurance information. For example, a customer will be asked to provide a rendering of the premises as part of acquiring a new insurance policy. In one embodiment, a customer is provided a discount on their insurance policy if they provide this additional information. As such, in this embodiment, the system interacts with information stored in both government-owned data stores and private ones as well.

In one embodiment the system must find the exact floor plan for the given address as it is not possible to use a similar building's floor plan. In one embodiment the initial visualization is of the ground floor of the building with additional floors being visualized as demanded by the response team. In another embodiment, all available floors are visualized.

Third, after receiving the full address, the one or more data stores will send back the floor plan. The system then generates a 3d view of the premises including information about the space, location of windows, doors, electrical appliances, gas-using appliances, and other relevant information. The fire department or other emergency team receives the information on them way to the location and can view the rendering on any general computing device.

The visualization system described above will automatically create a 3d model on the basis of the floorplan with the position of windows and doors added. The system will read in position of electrical and gas installations, as well as any other dangerous installations such as chemical storage units on the premises. The positions of the installations will be presented int the 3D model. The final output is a preview of a 3D model with highlighted areas of dangerous places, in one embodiment. The presentation occurs on a tablet screen, in one embodiment, or in virtual reality with VR glasses, or in augmented reality using an appropriate smartphone/tablet in combination with AR headwear.

A benefit of this system is that it will permit the intervention team to have a better understanding and evaluate potential flashover, back draft, explosion risk, and anticipated air movement that contribute to fire becoming larger or other serious problems such as flash-over during the time the firefighters are on the premises. The emergency responders are provided a visualization of interior walls, rooms, windows, gas and electrical installations. The visualization allows the responders to locate potential victims, reduce the risk of explosion, electrocution, and better prepared to address the emergency such as a fire. In one embodiment, the system provides a complete full 3D visualization within three minutes of receiving the address.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting, but are instead exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the terms "comprising" and "wherein." Moreover, in the following claims, the terms "first," "second," and "third," are used merely as labels, and are not intended to impose numerical requirements on their objects. Further, the limitations of the following claims are not written in means-plus-function format and are not intended to be interpreted based on 35 U.S.C. § 112(f) unless and until such claim limitations expressly use the phrase "means for" followed by a statement of function void of further structure.

The present methods can involve any or all of the steps or conditions discussed above in various combinations, as desired. Accordingly, it will be readily apparent to the skilled artisan that in some of the disclosed methods certain steps can be deleted or additional steps performed without affecting the viability of the methods.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," "more than" and the like include the number recited and refer to ranges which can be subsequently broken down into subranges as discussed above. In the same manner, all ratios disclosed herein also include all subratios falling within the broader ratio.

One skilled in the art will also readily recognize that where members are grouped together in a common manner, such as in a Markush group, the present invention encompasses not only the entire group listed as a whole, but each member of the group individually and all possible subgroups of the main group. Accordingly, for all purposes, the present invention encompasses not only the main group, but also the main group absent one or more of the group members. The present invention also envisages the explicit exclusion of one or more of any of the group members in the claimed invention.

The invention claimed is:

1. A system for generating formal premises designs for first responders at an address comprising:
   receiving the address of an urgent incident site and inputting the address into the system;
   retrieving for the system an informal two-dimensional rendering of the premises from at least one external data store;
   analyzing said informal two-dimensional rendering;
   determining features found on the premises depicted by the two-dimensional rendering, wherein said features comprise walls, doors, windows, and appliances;
   automatically generating a three-dimensional model of the premises on demand by the first responders using only the two-dimensional rendering of the premises highlighting dangerous areas;
   populating said three-dimensional rendering with interactive objects; and providing multiple views of the three-dimensional rendering containing interactive objects without additional input from first responders in route to the incident site address.

2. The system of claim 1 wherein said inputting into the system comprises taking a photograph of a two-dimensional hand drawn sketch of a premises.

3. The system of claim 1 wherein said analysis occurs in a distributed computing platform.

4. The system of claim 1 wherein said analysis further comprises an augmented reality preview of the three dimensional model.

5. The system of claim 1 wherein said interactive objects comprise virtual versions of furniture, household fixtures, and decorative items.

6. The system of claim 1 wherein said three-dimensional rendering comprises defining windows and doors in the three-dimensional model.

7. A system for generating formal premises designs for first responders at an address comprising:
    providing the address information to the system;
    obtaining initial data from at least one external data source, for the system on basis of address information;
    inputting into the system the initial data to represent one or more premises;
    analyzing said input to generate a three-dimensional model;
    modifying the three-dimensional model using augmented reality;
    determining features found on the premises, wherein said features comprise walls, doors, windows, and appliances;
    automatically generating a final three-dimensional model of the premises on demand by the first responders; without additional input from first responders in route to the address using only the two-dimensional reminder of the premises highlighting dangerous areas;
    generating a photorealistic visualization of the premises; and
    previewing the photorealistic visualization of the premises.

8. The system of claim 7 wherein said inputting step comprises providing the system a photo of a 2-dimensional sketch on paper.

9. The system of claim 7 wherein said inputting step comprises providing the system a video of a 2-dimensional sketch on paper.

10. The system of claim 7 wherein said inputting step comprises reading an existing three-dimensional model as a baseline.

11. The system of claim 7 wherein said inputting step comprises importing a completed three-dimensional model.

12. The system of claim 7 wherein said modification of input step further comprises use of artificial intelligence to generate the three-dimensional model.

13. The system of claim 7 wherein said final three-dimensional model is populated by one or more interactive objects.

14. The system of claim 13 wherein said interactive objects comprise furniture and surface finishes to be customized by an end user of the system.

15. The system of claim 7 wherein said previewing of the photorealistic visualization occurs using augmented reality.

16. The system of claim 7 wherein said previewing of the photorealistic visualization occurs using virtual reality.

17. The system of claim 7 wherein said analysis of input determines the type of each room depicted on the premises.

18. The system of claim 7 wherein said analysis of input confirms that each room depicted in the premises is a valid room.

19. The system of claim 7 wherein said analysis step requests user input to ensure proper detection of rooms within depicted premises.

20. The system of claim 7 wherein said analysis step comprises detection of doors and windows within the input design.

* * * * *